(12) United States Patent
Mannhart et al.

(10) Patent No.: US 6,179,938 B1
(45) Date of Patent: Jan. 30, 2001

(54) METHOD AND APPARATUS FOR ALIGNING THE BONDING HEAD OF A BONDER, IN PARTICULAR A DIE BONDER

(75) Inventors: Eugen Mannhart, Cham; Alois Ulrich, Zug; Thomas Guenther, Thalwil; Matthias Krieger, Steinhausen, all of (CH)

(73) Assignee: Esec SA, Cham (CH)

( * ) Notice: Under 35 U.S.C. 154(b), the term of this patent shall be extended for 0 days.

(21) Appl. No.: 09/175,204

(22) Filed: Oct. 19, 1998

(30) Foreign Application Priority Data

Oct. 30, 1997 (EP) .................................. 97118882

(51) Int. Cl.⁷ ............................. B32B 35/00; G06F 19/00
(52) U.S. Cl. ......................... 156/64; 700/121; 700/192; 702/153
(58) Field of Search .......................... 156/64, 378, 379; 29/834, 833, 832; 324/207.16, 207.23, 207.26, 207.19; 702/95, 153, 152, 151, 150, 33, 36; 700/114, 121, 192; 414/935

(56) References Cited

U.S. PATENT DOCUMENTS

| Re. 34,615 | 5/1994 | Freeman ................................. 348/95 |
| 3,337,941 | 8/1967 | Drop ....................................... 29/203 |
| 4,080,009 | 3/1978 | Marathe et al. ....................... 308/3.5 |
| 4,144,449 | 3/1979 | Funk et al. ............................ 250/221 |
| 4,253,788 | 3/1981 | Oaks et al. ............................ 414/403 |
| 4,298,772 | * 11/1981 | Kobayashi et al. ...................... 178/18 |
| 4,346,293 | 8/1982 | Fetzer ................................. 250/222 R |

(List continued on next page.)

FOREIGN PATENT DOCUMENTS

| 29 39 102 | 9/1979 | (DE) | ................................. B05C/1/08 |
| 29 39 102 | 4/1981 | (DE) | ................................. B05C/1/08 |
| 0 236 225 | 9/1987 | (EP) | ............................. H05K/13/02 |
| 0 462 596 A1 | 12/1991 | (EP) | ............................. H01L/21/00 |
| 0 476 577 A2 | 3/1992 | (EP) | ............................. H05K/13/00 |
| 2 111 863 | 12/1981 | (GB) | ............................. B05B/13/00 |
| 2 111 863 | 7/1983 | (GB) | ............................. B05B/13/00 |
| 2 183 820 | 6/1987 | (GB) | ............................... G05D/3/10 |
| 3-008655 | 1/1991 | (JP) | ............................. B65H/26/00 |
| 3-133763 | 6/1991 | (JP) | ............................. B65D/73/02 |
| 5-145283 | 6/1993 | (JP) | ............................. H05K/13/02 |
| 06089910 | 3/1994 | (JP) | ............................. H01L/21/52 |
| 6-089910 | 3/1994 | (JP) | ............................. H01L/21/52 |
| 09-064094 | 3/1997 | (JP) | ............................. H01L/21/60 |
| 09064094 | 3/1997 | (JP) | ............................. H01L/21/60 |

OTHER PUBLICATIONS

Gore, et al.; "Fluxing Tool Incorporated Into Part Feeder; Specifically for Assembly of C–5 Chip Carriers"; Motorola, Inc.; Technical Developments, vol. 13; Jul. 1991; pp. 36–37.
Gore, et al., Fluxing Tool Incorporated Into Part Feeder; Specifically for Assembly of C–5 Chip Carriers, Motorola Inc., Technical Developments, vol. 13, Jul. 1991, pp. 36–37.

*Primary Examiner*—James Sells
*Assistant Examiner*—George R. Koch, III
(74) *Attorney, Agent, or Firm*—D'Alessandro & Ritchie

(57) ABSTRACT

A method of aligning the bonding head of a bonder, in particular a die bonder, or of a pick and place machine comprising the steps of a) placing an alignment plate provided with two plane parallel surfaces on a supporting surface which is set plane parallel to the bonding surface upon which the semiconductor chip will be bonded to the carrier material; b) calibration of a measuring device, the signal of which is dependent upon the position of the alignment plate; c) grasping the alignment plate with the bonding head of the bonder and holding the alignment plate free at a slight distance above the measuring device; and d) alignment of the bonding head until the signal from the measuring device is equal to the signal following step b).

6 Claims, 4 Drawing Sheets

U.S. PATENT DOCUMENTS

| | | | |
|---|---|---|---|
| 4,351,264 | 9/1982 | Flaum et al. | 118/203 |
| 4,378,134 | 3/1983 | Eddy | 308/3.5 |
| 4,383,359 | 5/1983 | Suzuki et al. | 29/712 |
| 4,584,047 | 4/1986 | Vanderpool et al. | 156/361 |
| 4,610,083 | 9/1986 | Campisi et al. | 29/832 |
| 4,615,093 | 10/1986 | Tews et al. | 29/407 |
| 4,730,945 | 3/1988 | Luther et al. | 384/45 |
| 4,810,154 | 3/1989 | Klemmer et al. | 414/222 |
| 4,819,326 | 4/1989 | Stannek | 29/837 |
| 4,863,149 | 9/1989 | Luther et al. | 269/8 |
| 4,868,007 | 9/1989 | Taguchi | 427/96 |
| 4,915,770 | 4/1990 | Haeda et al. | 156/344 |
| 4,934,891 | 6/1990 | Hawkswell | 414/223 |
| 4,937,511 | 6/1990 | Herndon et al. | 318/568.21 |
| 5,023,544 | 6/1991 | Vallone et al. | 324/158 F |
| 5,024,720 | 6/1991 | Boss et al. | 156/584 |
| 5,086,559 | 2/1992 | Akatsuchi | 29/834 |
| 5,150,423 | 9/1992 | Hoki | 382/8 |
| 5,157,617 | 10/1992 | Ramsey | 364/478 |
| 5,157,734 | 10/1992 | Chen et al. | 382/8 |
| 5,191,693 | 3/1993 | Umetsu | 29/429 |
| 5,195,234 | 3/1993 | Pine et al. | 29/720 |
| 5,213,653 | 5/1993 | Akahori et al. | 156/584 |
| 5,248,362 | 9/1993 | Sissons | 156/205 |
| 5,249,239 | 9/1993 | Kida | 382/8 |
| 5,275,657 | 1/1994 | Duffy et al. | 118/224 |
| 5,278,634 | 1/1994 | Skunes et al. | 356/400 |
| 5,289,625 | 3/1994 | Umetsu et al. | 29/426.3 |
| 5,309,223 | 5/1994 | Konicek et al. | 356/375 |
| 5,311,304 | 5/1994 | Monno | 348/87 |
| 5,342,460 | 8/1994 | Hidese | 156/64 |
| 5,380,099 | 1/1995 | Teramachi | 384/45 |
| 5,400,497 | 3/1995 | Watanabe et al. | 29/705 |
| 5,415,693 | 5/1995 | Yoneda et al. | 118/664 |
| 5,455,409 | 10/1995 | Smith et al. | 235/385 |
| 5,459,794 | 10/1995 | Ninomiya et al. | 382/145 |
| 5,475,919 | 12/1995 | Wu et al. | 29/841 |
| 5,488,771 | 2/1996 | Devitt et al. | 29/898.02 |
| 5,499,756 | 3/1996 | Banerji et al. | 228/214 |
| 5,515,600 | 5/1996 | Iwasaki et al. | 29/740 |
| 5,547,537 | 8/1996 | Reynolds et al. | 156/351 |
| 5,553,376 | 9/1996 | Solanki et al. | 29/833 |
| 5,559,727 | 9/1996 | Deley et al. | 364/559 |
| 5,562,384 | 10/1996 | Alvite et al. | 414/222 |
| 5,564,188 | 10/1996 | Akasako et al. | 29/898.03 |
| 5,592,562 | 1/1997 | Rooks | 382/150 |
| 5,650,081 | 7/1997 | Hudson | 219/229 |
| 5,669,970 | 9/1997 | Balog et al. | 118/213 |
| 5,694,443 | 12/1997 | Stone et al. | 377/6 |
| 5,708,419 | 1/1998 | Isaacson et al. | 340/572 |
| 5,713,125 | 2/1998 | Watanabe et al. | 29/833 |
| 5,715,594 | 2/1998 | Patterson et al. | 29/842 |
| 5,735,040 | 4/1998 | Ochi et al. | 29/841 |
| 5,788,379 | 8/1998 | Reeve | 384/41 |
| 5,794,330 | 8/1998 | Distefano et al. | 29/840 |
| 5,813,304 | 9/1998 | Matthias et al. | 83/365 |
| 5,838,754 | 11/1998 | Olson et al. | 364/478.07 |
| 5,885,052 | 3/1999 | Tsuji et al. | 414/744.6 |
| 5,901,892 | 5/1999 | Takanashi | 226/27 |
| 5,938,890 | 8/1999 | Schlinkmann et al. | 156/541 |
| 5,941,674 | 8/1999 | Briehl | 414/417 |
| 5,975,395 | 11/1999 | Takada et al. | 226/162 |
| 5,976,306 | 11/1999 | Davis et al. | 156/344 |

\* cited by examiner

METHOD AND APPARATUS FOR ALIGNING THE BONDING HEAD OF A BONDER, IN PARTICULAR A DIE BONDER

PRIORITY CLAIM

The present application claims priority under 35 U.S.C. § 119 based upon European application no. 97118882.6, filed Oct. 30, 1997.

BACKGROUND OF THE INVENTION

1. Field of the Invention

The invention relates to a bonder, in particular to a die bonder, and to a pick and place machine, and to an apparatus to be used in connection with such a machine which allows a simple alignment of its bonding head.

2. The Background Art

A die bonder is a machine which sticks or bonds a semiconductor chip onto a carrier, specifically a lead frame. In order to ensure that the subsequent wire bonding may take place without any problems, the spatial positioning of the bonding head of the die bonder must be adjusted such that the semiconductor chip bonds onto the carrier in a plane-parallel manner within specified tolerances of approximately 10μm.

Pick and place machines are well known. They are used, for example, to bond a semiconductor chip onto another semiconductor chip. Such processes are known as flip-chip or C4. Pick and place machines are also widely used to place all sorts of electronic components on printed circuit boards.

The object of the invention is to provide means with which the bonding head of a bonder, in particular of a die bonder, or a pick and place machine may be aligned in a simple manner.

BRIEF DESCRIPTION OF THE INVENTION

According to a first embodiment of the invention, a method for aligning the bonding head of a bonder, in particular of a die bonder, or a pick and place machine is provided. An alignment plate provided with two plane parallel surfaces is placed on a supporting surface which extends plane parallel to the bonding surface, upon which the semiconductor chip is to be bonded to the carrier material. A measuring device is calibrated, the signal of the measuring device being dependent upon the position of the alignment plate. The alignment plate is then taken hold of by the bonding head of the bonder and held above the measuring device, preferably by a small distance. Then, the bonding head is positionally aligned until the signal from the measuring device is equal to the signal after the calibration.

In a second embodiment of the present invention, an apparatus for implementing the above method is provided. The alignment plate may have a metalized or ferromagnetic surface.

The measuring device has at least three coils, preferably three or four, arranged in a plane approximately parallel to the supporting surface. A display may be configured to display at least the difference between two of the signals supplied by the three or more coils. Preferably, the apparatus is designed so that, at any one time, only one of said at least three coils produces a significant signal. The apparatus may be configured to allow the coils to be operated in sequence, i.e. with time division multiplexing.

BRIEF DESCRIPTION OF THE DRAWING FIGURES

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figure 1:
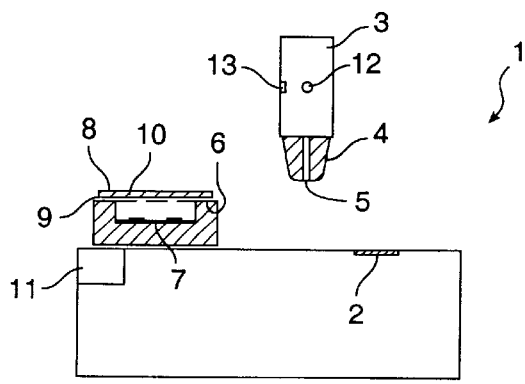
FIG. 1 is a diagram depicting a die bonder with an apparatus for aligning the bonding head according to the present invention.

The invention will now be described with reference to a die bonder. FIG. 1 is a schematic diagram of the die bonder 1 with a bonding surface 2 on which semiconductor chips are bonded onto lead frames, or any other carrier material, one after another. The semiconductor chip may also be applied to the carrier material as a so-called flip-chip. The bonding of a semiconductor chip proceeds with the bonding head 3 of the die bonder 1 taking hold, or grasping, of the semiconductor chip by vacuum suction at the point provided for this purpose, and by placing it on the lead frame. The bonding head 3 has a rubber part 4 with a suction aperture 5 so that the semiconductor chip can form a seal with the suction aperture 5.

The bonding head 3 may be fitted with rubber parts 4 of different sizes for use with semiconductor chips of different sizes. After exchange of the rubber part 4, the bonding head 3 must be realigned. After alignment, the bonding head 3 must bond the semiconductor chip to the carrier material such that no point on the edge of the surface of the semiconductor chip projects by more than approximately 10 m beyond any other point on its surface. The die bonder 1 has a supporting surface 6 which is aligned plane-parallel to the bonding surface 2. Directly below the supporting surface 6 and fixedly connected thereto there is a measuring device 7 which delivers signals dependent upon the current position of an alignment plate 10 having two plane-parallel surfaces 8 and 9. The signals are visually displayed by a display 11. The bonding head 3 may be rotated about two axes manually, by means of two screws 12 and 13, or by means of electric drives, so that a semiconductor chip which it has to position may be bonded in a plane-parallel manner to the bonding surface 2 within prespecified tolerances.

The alignment of the bonding head 3 takes place in accordance with the following steps:

a) placing the alignment plate 10 on the supporting surface 6;

b) calibrating the measuring device 7;

c) grasping the alignment plate 10 with the rubber part 4 of the bonding head 3 and holding the alignment plate 10 free at a slight distance above the measuring device 7; and d) positionally adjusting the bonding head 3, manually or automatically, until the signal from the measuring device 7 is equal to the signal after step b.

After step a, the alignment plate 10 is located in a predetermined reference position plane parallel to the bonding surface 2. The signals supplied by the measuring device 7 when the alignment plate 10 is in this position are sensed during step b. After step c, the alignment plate 10 is in an inclined position defined by the current adjustment of the bonding head 3 and by the rubber part 4. During step d, the inclined position of the alignment plate 10 is moved towards the reference position until the signals of the measuring device 7 indicate that the alignment plate 10 is held by the bonding head 3 plane parallel to the bonding surface 2.

Calibration of the measuring device 7 is understood to be measuring and storing the signal or signals supplied by the measuring device 7 as reference signal or reference signals when the alignment plate 10 is in the reference position, or to be adjusting the measuring device 7 when the alignment plate 10 is in the reference position so that its signal shows a predetermined value, for example the value "0". Step b of the method will be described in more detail hereinafter using examples.

A suitable material for the alignment plate 10 is, for example, polycarbonate, wherein at least the surface 9, but preferably both surfaces 8 and 9, are metalized. The weight of the alignment plate 10 of a few grams is then within the range covered by semiconductor chips of various sizes.

Conventional methods of aligning the bonding head 3 have the disadvantage that the rubber part 4 is not taken into account. The rubber part 4 itself is, however, a source of unwanted inclination (tilt) since the suction aperture 5 of such a part cannot be manufactured and mounted on the bonding head 3 with the required precision. The advantage of the method according to the present invention is that the tilt of the semiconductor chip caused by the indispensable rubber part 3 of the bonding head 3 itself is also eliminated.

Figure 2A:
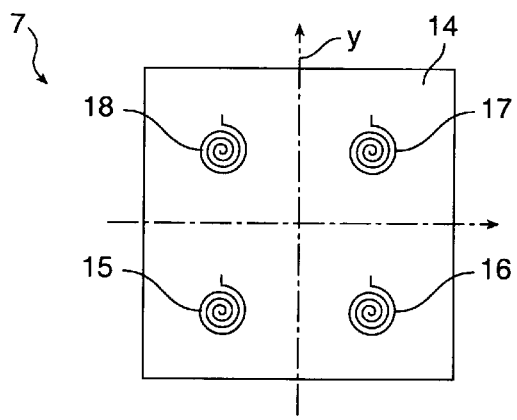
FIGS. 2A and 2B are diagrams showing the apparatus for aligning the bonding head in which coils serve as measuring device in accordance with the present invention.
Figure 2B:
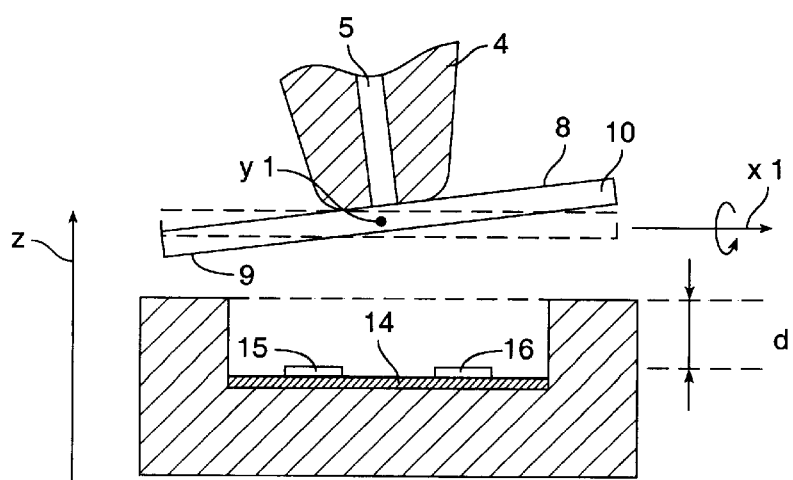
Figure 3:
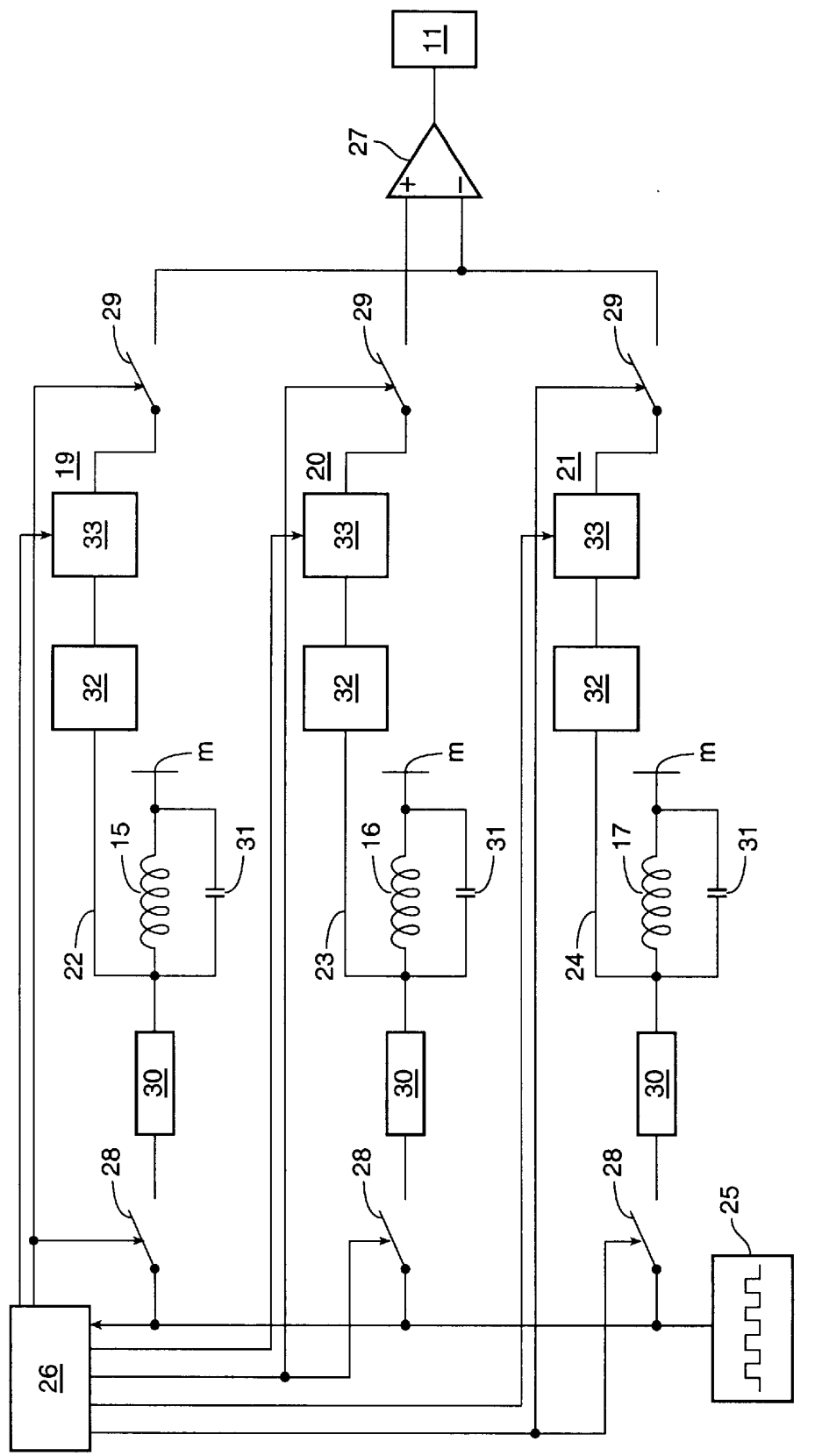
FIG. 3 is a circuit diagram illustrating a circuit for operating the coils in the time division multiplex.

Usual inductive range-finding is a suitable measurement technique in which the ohmic resistance and/or the inductance of a coil excited by an alternating current changes when a metallic or ferromagnetic object is moved in its magnetic near field. FIGS. 2A and 2B show in plan view and in side view respectively a preferred embodiment in which a circuit board 14, provided with at least three coils 15, 16 and 17, but preferably with four coils 15, 16, 17 and 18, serves as the measuring device 7. The coils 15, 16, 17 and 18 are arranged in the four quadrants of a Cartesian xy coordinate system, symmetrically with respect to the origin. The circuit board 14 is arranged plane parallel at a distance d of approximately one millimeter from the supporting surface 6. The coils 15, 16, 17 and 18 are flat coils formed from circuit board paths or tracks. The surface 9 of the alignment plate 10 facing the coils 15, 16, 17 and 18 is provided with a metalized or a ferromagnetic surface. Referring also to FIG. 3, the coils 15, 16, 17 and 18 supply respective signals S1 19, S2 20, S3 21, and S4 (not shown) which depend upon the distance d of the corresponding coil 15, 16, 17, and 18 from the alignment plate 10. The signals S1 19, S2 20, S3 21 and S4 (not shown) of the coils 15, 16, 17, and 18 respectively should be understood already to be the electronically preprocessed signal. When the alignment plate 10 is rotated clockwise about the imaginary axis y1 after adjustment of the bonding head 3, the signals S2 20 and S3 21 of the coils 16 and 17 respectively decrease, while the signals S1 19 and S4 (not shown) of the coils 15 and 18 respectively increase. Consequently the difference signals S2-S1 and S3-S4 also decrease. When the alignment plate 10 is rotated clockwise about the imaginary axis x1 after another adjustment of the bonding head 3, the signals S1 19 and S2 20 decrease, while the signals S3 21 and S4 (not shown) increase. In this case the two difference signals S2-S3 and S1-S4 decrease. When the circuit board 14 is completely flat and all the coils have the same characteristic S(z), where z denotes the direction perpendicular to the xy plane, the two difference signals D1=S2-S1 and D2=S2-S3 disappear precisely when the alignment plate 10 is held plane parallel to the circuit board 14.

Since the circuit board 14 is not necessarily oriented plane parallel to the supporting surface 6 or the bonding surface 2 (FIG. 1) with the required precision, due to unavoidable manufacturing tolerances, and since the coils 15, 16, 17 and 18 as a rule have different respective characteristics S1(z), S2(z), S3(z) and S4(z), a calibration procedure has to be carried out at least once. In this calibration procedure, the alignment plate 10 is placed on the supporting surface 6 and then either i) the difference signals $D1_{cal}=S2_{cal}-S1_{cal}$ and $D2_{cal}=S2_{cal}-S3_{cal}$ are stored, or ii) the signals $S1_{cal}$ and $S3_{cal}$ are balanced until they have the value of $S2_{cal}$, that is to say until the difference signals D1 and D2 disappear, (D1=0 and D2=0).

In the case of i), the alignment of the bonding head 3 follows afterwards in accordance with step d), by adjusting the bonding head 3, that is holding the alignment plate 10 free, until the difference signals D1 and D2 have the respective values $D=D1_{cal}$ and $D2=D2_{cal}$. In the case of ii), the alignment of the bonding head 3 is performed by adjusting the bonding head 3 until the difference signals D1 and D2 disappear. For example, first the circuit is operated by applying the oscillator signal alternately to the coils 15 and 16 and by displaying the difference signal D1=S2-S1 so that the difference signal D1 can be made to disappear by adjusting the bonding head 3 by means of the screw 12. Then, the signal is applied alternately to the coils 17 and 16 and the difference signal D2=S2-S3 is displayed so that the difference signal D2 can be made to disappear by adjusting the bonding head 3 by means of the screw 13.

Whether a calibration procedure has to be carried out each time the bonding head 3 is aligned or only occasionally depends upon the stability of the measuring device 7 with respect to external influences such as temperature, humidity and so forth.

The three coils 15, 16 and 17 are sufficient per se for the alignment. For reasons of redundancy, it can be useful, however, also to include the fourth coil 18. Since the adjacently arranged coils 15, 16 and 17 can influence one another, a mode of operation is preferred in which at any time only one of the coils 15, 16 and 17 produces a significant magnetic field. Such a mode is for example the time division multiplex procedure.

FIG. 3 shows a circuit for operating the coils 15, 16 and 17 in time division multiplex. The coils 15, 16 and 17 are arranged in parallel paths 22–24. The circuit comprises an oscillator 25, a control device 26 and a difference former 27, the output of which is supplied to the display 11. Each path 22–24 has on its input side a switch 28 and on its output side a switch 29, which switches can be actuated by the control device 26. The switch 28 is connected to the oscillator 25. The output of each path 22–24 is supplied to the difference former 27. A resistor 30 and a capacitor 31 are connected after the switch 28, wherein the capacitor 31 is located parallel to the corresponding coil 15, 16 or 17. One connection of the coil and of the capacitor 31 is connected to ground m, while the connection connected to the resistor 30 is supplied to a detector 32 and to a subsequent sample-and-hold module 33. The output of the sample-and-hold module 33 forms the output of the path. Each of the sample-and-hold modules 33 is activated by the control device 26 for obtaining and storing a new value. For the detector 32, a peak amplitude detector or a synchronous detector may be used. The difference former 27 may be, for example, an operational amplifier configured as a differential amplifier, the inverting input of the operational amplifier being supplied with either the signal S1 19 or the signal S3 21, and the non-inverting input of the operational amplifier being supplied with the signal S2 20, so that the difference signal D1=S2−S1 or the difference signal D2=S2−S3 is displayed on the display 11 connected thereafter.

Figure 4:
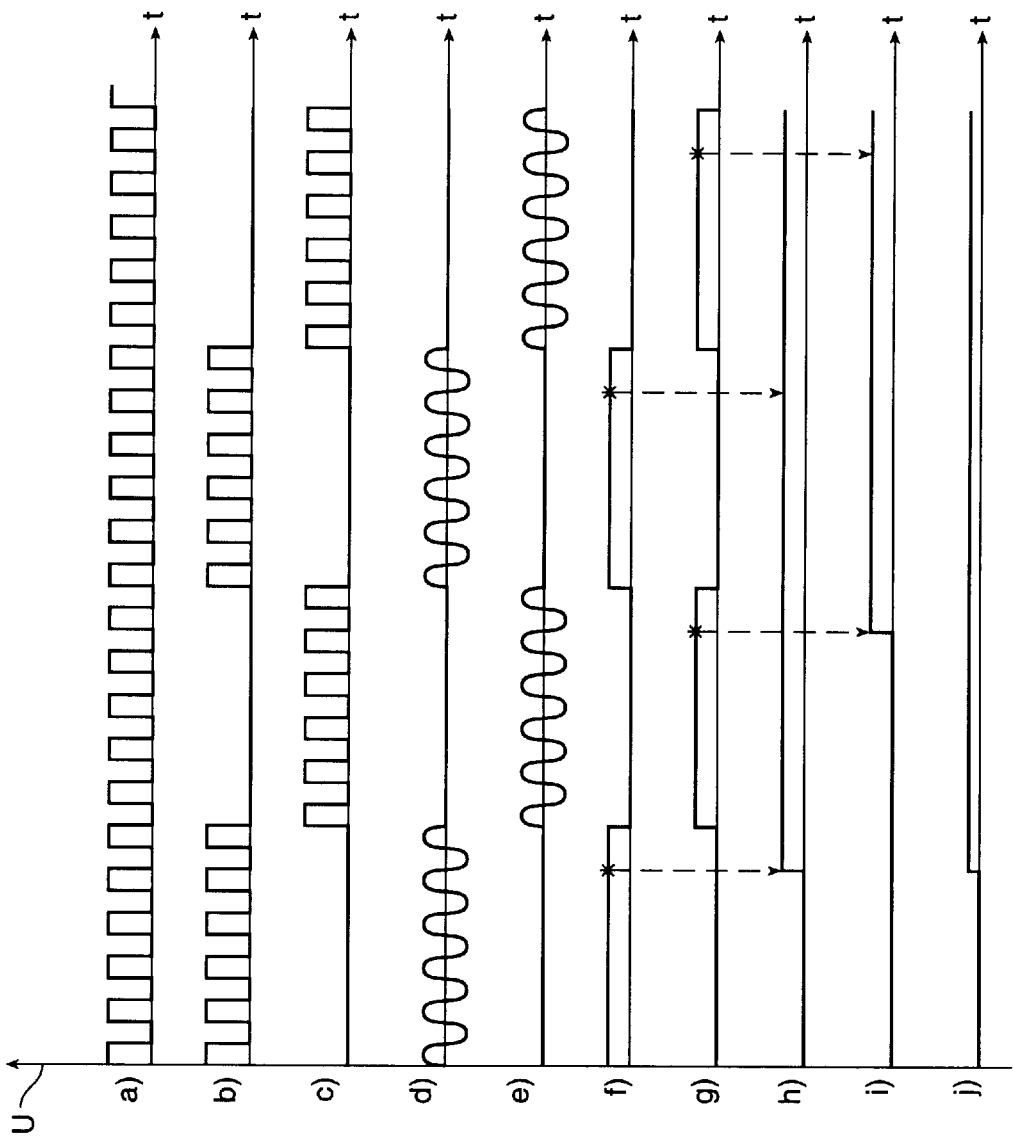
FIG. 4 depicts voltage diagrams.

Switches 28 and 29 are switched on and off cyclically by the control device 26, so that at any one time only one path 22–24 is in operation. FIG. 4 illustrates, for the case where the bonding head 3 is to be aligned using the difference signal D1=S2−S1, the development of the following voltages U as a function of time t:

a) voltage at the output of the oscillator 25, b) voltage following the switch 28 of the path 22 with the coil Sp1 15, c) voltage following the switch 28 of the path 23 with the coil Sp2 16, d) voltage at the input of the detector 32 of the path 22, e) voltage at the input of the detector 32 of the path 23, f) voltage at the output of the detector 32 of the path 22, g) voltage at the output of the detector 32 of the path 23, h) voltage at the output of the sample-and-hold module 33 of the path 22, i) voltage at the output of the sample-and-hold module 33 of the path 23, and j) voltage at the output of the difference former 27.

The times at which the control device 26 directs the sample-and-hold module 33 to obtain a new measured value are also shown. The frequency which the oscillator 25 applies to the flat coils 15–17 is between approximately 1 and 10 MHz, and is preferably 4 MHz. The capacitance of the capacitors 31 is to be matched so that the resonance frequency of the resonating circuit formed by the capacitor 31 and the corresponding coils 15, 16 or 17 corresponds approximately to the oscillator frequency. The oscillator frequency is preferably chosen so that it lies in the middle of the rising edge of the resonance peak, where the derivative of the signal from the coils 15, 16 or 17 to the oscillator frequency is large. The signal produced by the oscillator 25 is advantageously a square wave. Instead of the oscillator 25 a microprocessor with a suitable output may also be used. By stepping down the frequency generated by the oscillator 25, the control device 26 derives the frequency with which the switches 28 and 29 of the three paths 22–24 are to be opened and closed, and with which the sample-and-hold modules 33 are to be controlled.

The components of the circuit are advantageously mounted directly on the underside of the circuit board 21, which greatly increases tolerance to interference from external influences.

Figure 5:
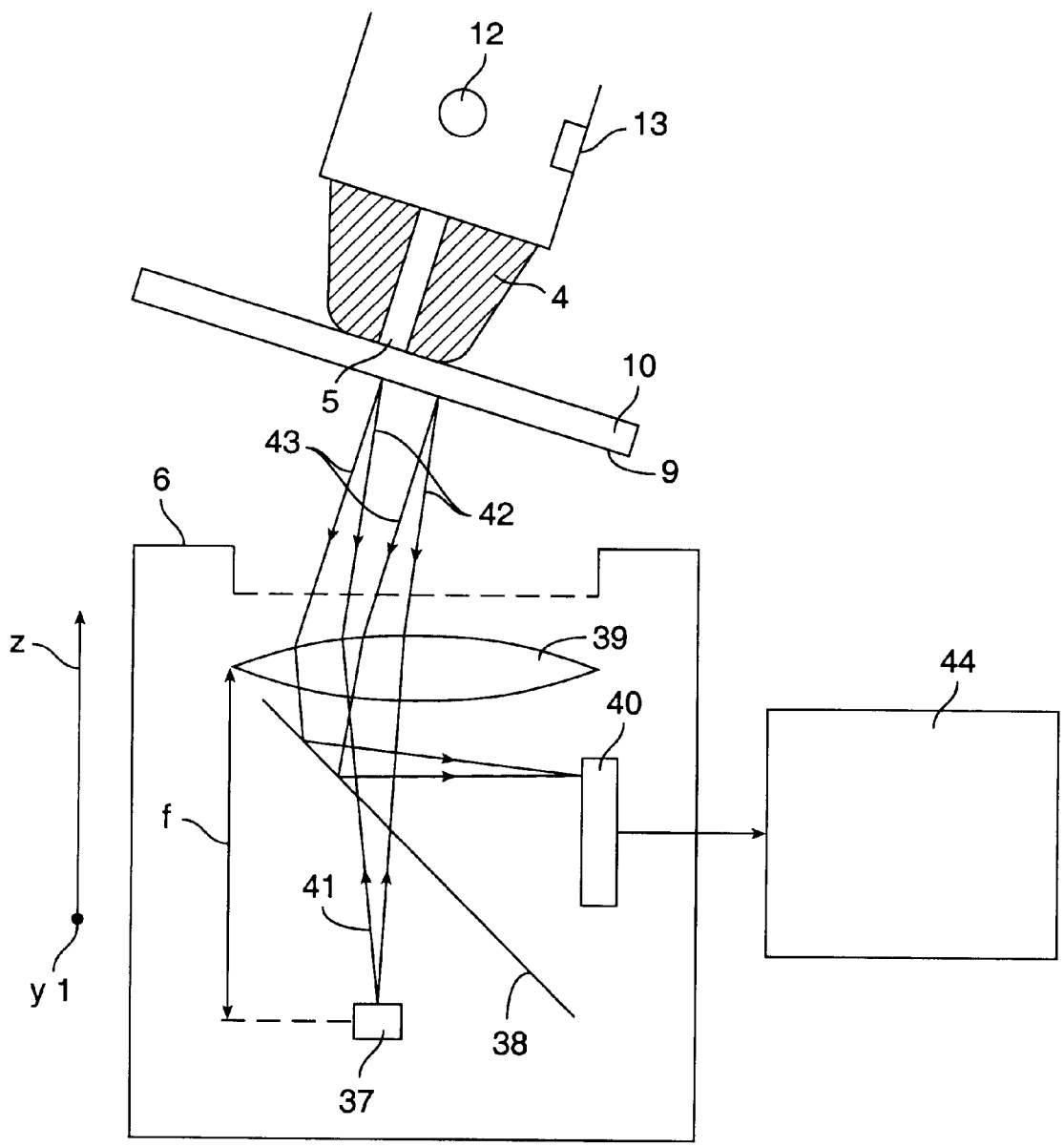
FIG. 5 is a diagram depicting the apparatus for aligning the bonding head, in which an optical measuring device is used in accordance with the present invention.

FIG. 5 shows an embodiment in which an optical system serves as the measuring device 7. The surface 9 of the alignment plate 10 is, in this case, a surface with good optical reflectivity, such as a mirror surface. The optical system is provided with a light source 37, a semi-transparent mirror 38, a lens 39 and a photodetector 40. The light source 37 and the photodetector 40 are located in the focal point f, or focal plane, of the lens 39. The light 41 emitted from the point light source 37 is incident upon the surface 9 of the alignment plate 10 as a plane wave 42, because of the lens 39, and is reflected there and at least partially by the semi-transparent mirror 38 onto the photodetector 40, whereupon the lens 39 focuses the reflected parallel light 43 back onto the photodetector 40. A two-dimensional array of photosensors is advantageously used as the photodetector 40, for example a CCD (charge coupled device) or a PSD (photosensitive device). A normal screen 44 can be used as the display 11 for the display signals supplied by the photosensors. For calibration of the optical system in accordance with point b) of the method, the position of the photodetectors in the y1 and z directions is changed until the light spot corresponding to the reflected light beam 43 appears in the center of the screen 44. The direction y1 is perpendicular to the surface of the drawing. For alignment according to point d) of the method, the bonding head 3 is adjusted until the light spot corresponding to the reflected light beam 43 again appears in the center of the screen 43.

The apparatuses described for aligning the bonding head 3 of the die bonder 1 may be integrated in the die bonder 1 or be provided as accessories so that existing die bonders 1 can be retrofitted. In the latter case, the supporting surface 6 must be orientated plane parallel to the bonding surface 2 before the alignment of the bonding head may be carried out. It will be appreciated that although particular embodiments of the invention have been described, many modifications/additions and/or substitutions may be made within the spirit and scope of the present invention.

What is claimed is:

1. A method for aligning a bonding head of a bonder or a pick and place machine, said bonding head compromising a nozzle having a rubber tip, wherein the bonder or pick and place machine places a semiconductor chip or electronic component onto a bonding surface of a carrier, the method comprising the steps of:

grasping an alignment plate with said rubber tip and holding said alignment plate free at a small distance above a measuring device; and positionally adjusting said bonding head so that said alignment plate is parallel to said bonding surface until at least one signal generated by said measuring device is equal to a reference signal.

2. The method of claim 1, wherein said alignment plate has a metalized or ferromagnetic surface, said measuring device has at least three coils arranged in a plane approximately parallel to said supporting surface, said coils supply each a signal based on the position of said alignment plate and said signals of said coils are used to generate said at least one signal of the measuring device.

3. The method of claim 1, wherein said alignment plate has an optically reflective surface and said measuring device is an optical system arranged to illuminate said alignment plate with a beam of parallel light.

4. The method of claim 1, further including the step of placing said alignment plate on a supporting surface extending parallel to said bonding surface and storing the signal or signals generated by said measuring device as reference signal or reference signals, respectively.

5. The method of claim 4, wherein said alignment plate has a metalized or ferromagnetic surface, said measuring device has at least three coils arranged in a plane approximately parallel to said supporting surface, said coils supply each a signal based on the position of said alignment plate and said signals of said coils are used to generate said at least one signal of the measuring device.

6. The method of claim 4, wherein said alignment plate has an optically reflective surface and said measuring device is an optical system arranged to illuminate said alignment plate with a beam of parallel light.

* * * * *

UNITED STATES PATENT AND TRADEMARK OFFICE
CERTIFICATE OF CORRECTION

PATENT NO.    : 6,179,938 B1
DATED         : January 30, 2001
INVENTOR(S)   : Eugen Mannhart, Alois Ulrich, Thomas Günther and Matthias Krieger It is certified that error appears in the above-identified patent and that said Letters Patent is hereby corrected as shown below:

Title page,
Item [75] Inventors, replace "Guenther" with -- Günther --; and
Item [57] ABSTRACT, at the end, insert -- Apparatuses suitable for implementing the method are also disclosed. --

Column 2,
Line 39, replace "m" with -- $\mu$m --.

Signed and Sealed this

Fourth Day of June, 2002

*Attest:*

*Attesting Officer*

JAMES E. ROGAN
*Director of the United States Patent and Trademark Office*